US005939682A

United States Patent [19]
Hartmann

[11] Patent Number: 5,939,682
[45] Date of Patent: Aug. 17, 1999

[54] MOLDED IN SPEAKER GRID

[75] Inventor: Karl Hartmann, Sturgis, Mich.

[73] Assignee: UT Automotive Dearborn, Inc., Dearborn, Mich.

[21] Appl. No.: 09/085,977

[22] Filed: May 27, 1998

[51] Int. Cl.$^{6}$ .................... H05K 5/00
[52] U.S. Cl. .................... 181/150; 181/141
[58] Field of Search .................... 181/141, 150, 181/175, 199; 381/86

[56] References Cited

U.S. PATENT DOCUMENTS

| | | | |
|---|---|---|---|
| 3,666,040 | 5/1972 | Junk | 181/150 |
| 4,832,150 | 5/1989 | Just et al. | 181/175 |
| 5,228,090 | 7/1993 | Marler | 381/86 |
| 5,699,438 | 12/1997 | Smith et al. | 181/141 |

*Primary Examiner*—Khanh Dang
*Attorney, Agent, or Firm*—Howard & Howard

[57] ABSTRACT

The present invention provides a composite vehicle trim panel having enhanced sound transmission characteristics and a method for manufacturing the same. In the most preferred embodiment, the composite vehicle trim panel comprises a substrate layer with a first aperture, a second substrate layer with a second aperture, and a grid interposed between the first substrate layer and the second substrate layer. The grid overlays the first aperture and the second aperture, which are aligned with each other. The first substrate layer, grid, and second substrate layer are secured to each other by compression molding to form a composite vehicle trim panel. A finish layer is then laminated to the first substrate layer. The use of the grid provides an increased open area for sound transmission through the composite vehicle trim panel over previous designs.

20 Claims, 3 Drawing Sheets

MOLDED IN SPEAKER GRID

BACKGROUND OF THE INVENTION

This invention relates to a unique speaker mount for a vehicle.

Most vehicles include an audio system having a number of audio speakers. It is necessary to provide a location for mounting the audio speakers in the vehicle. Most often, the audio speakers are mounted behind a trim panel of the vehicle. Typically, a pair of audio speakers are mounted in a rear shelf located behind a back seat of the vehicle. To permit the sound emanating from the audio speaker to enter the passenger compartment, it is necessary to provide some sort of opening in the trim panel.

The past practice with respect to trim panels has been to put a series of holes in the trim panel over the location of each of the audio speakers. The trim panel is then covered with either a finish layer or a speaker grill. Putting a single large hole in the trim panel makes it difficult to provide sufficient strength to the trim panel.

One disadvantage of the previous method is that there are structural limits on the number of holes that can be placed in the trim panel while maintaining sufficient strength of the trim panel. This structural limitation results in limited sound transmission through the trim panel. Typically only approximately 65% of the area of the trim panel covering each audio speaker is open. These structural limitations also influence the quality of the sound transmitted through the trim panel. Another disadvantage is that it can be difficult to match the color of a speaker grill to the color of the trim panel finish layer. Aesthetic concerns regarding the pattern of openings in the speaker grill further limit the open area for sound transmission through the speaker grill.

Thus, it is desirable to provide a vehicle trim panel with enhanced sound transmission characteristics, while maintaining the strength of the trim panel. It is also desirable to provide such a trim panel that can be easily matched to the color scheme of the passenger compartment.

SUMMARY OF THE INVENTION

The present invention relates to a vehicle trim panel having enhanced sound transmission characteristics and a method for producing the vehicle trim panel. In the preferred embodiment, the vehicle trim panel comprises a composite. The composite vehicle trim panel consists of a first substrate layer having at least a first aperture through it and a second substrate layer having at least a second aperture through it. The first aperture and the second aperture are aligned with each other. A grid covers the first aperture and the second aperture. Preferably the grid is positioned between the two layers. The first substrate layer, second substrate layer and grid are secured to each other to form a composite vehicle trim panel. In the most preferred embodiment, the first substrate layer and the second substrate layer comprise a resinated shoddy blanket and a finish layer is secured to the first substrate layer.

The grid is preferably a mesh grid formed of a plurality of crossing thin members. The mesh is preferably formed of steel or other rigid material.

A preferred method of the present invention comprises the steps of laying down a second substrate layer having a second aperture. Then laying down a grid over the second aperture. Next, a first substrate layer having a first aperture is placed over the grid and the second substrate. The first aperture and the second aperture are aligned with each other and the first substrate layer, grid and the second substrate layer are secured to each other. In the most preferred method, the first substrate layer, second substrate layer and the grid are secured to each other by compression molding.

The present invention permits the incorporation of a grid into a composite vehicle trim panel. The grid permits the composite vehicle trim panel to have enhanced sound transmission characteristics while maintaining the strength of the composite vehicle trim panel. In addition, the present invention permits a finish layer to be secured to the composite vehicle trim panel incorporating the grid, thus permitting a uniform color scheme in the interior of the passenger compartment of a vehicle.

These and other features and advantages of this invention will become more apparent to those skilled in the art from the following detailed description of the presently preferred embodiment. The drawings that accompany the detailed description can be described as follows.

DETAILED DESCRIPTION OF THE PREFERRED EMBODIMENT

Figure 1A:
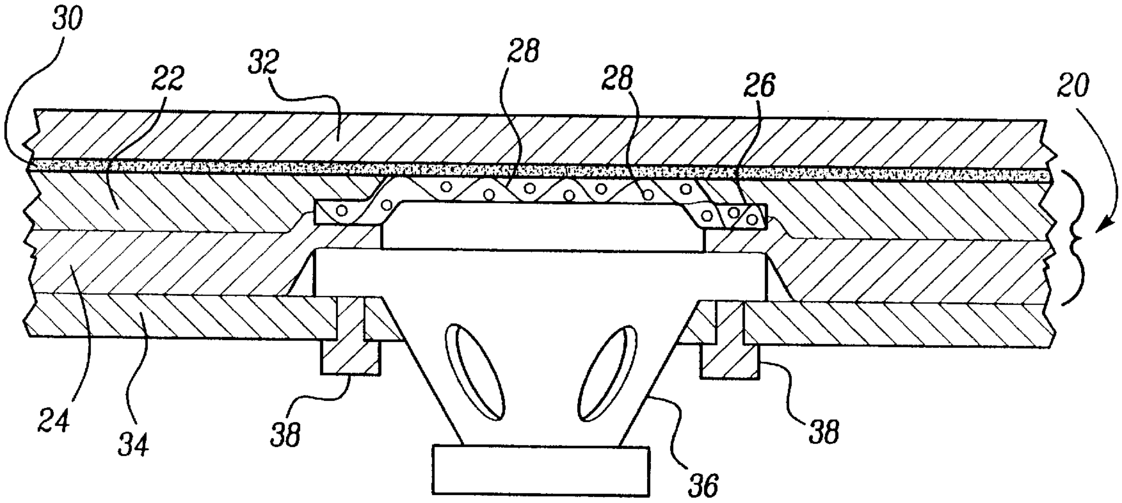
FIG. 1A is a cross-sectional view of an audio speaker and a composite vehicle trim panel designed according to the present invention incorporated into a rear shelf of a vehicle.

In FIG. 1A, a composite vehicle trim panel is generally shown at 20. The composite trim panel 20 includes a first substrate layer 22, a second substrate layer 24, and a grid 26. Grid 26 is interposed between first substrate layer 22 and second substrate layer 24. Grid 26 is composed of a network of strands 28. An adhesive 30 secures a finish layer 32 to first substrate layer 22. Although in FIG. 1A adhesive 30 is shown uniformly across grid 26, as will be understood by one of ordinary skill in the art, adhesive 30 would be found only on strands 28 of grid 26. When incorporated in a rear shelf of a vehicle, composite vehicle trim panel 20 with attached finish layer 32 is placed over a support plate 34. An audio speaker 36 is centered under grid 26. A plurality of fasteners 38 secure audio speaker 36 to the support plate 34.

Figure 1B:
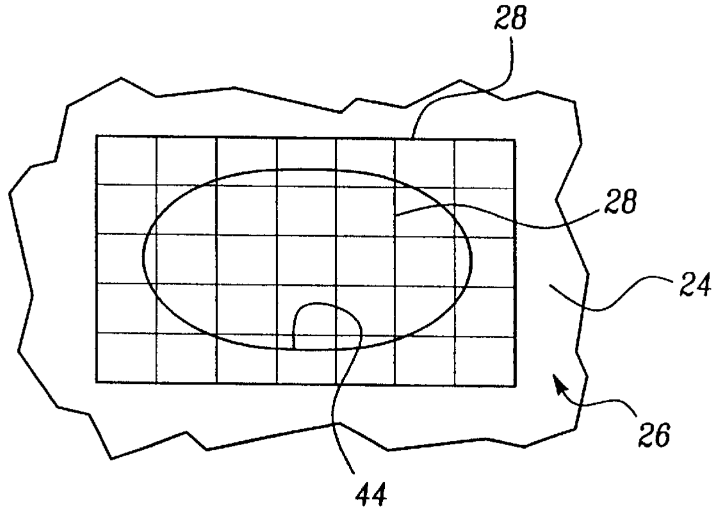
FIG. 1B shows a top view of a grid of the present invention placed over an aperture.

FIG. 1B shows a detailed view of grid 26 in relation to second substrate layer 24. As shown, strands 28 form grid 26 by extending in generally perpendicular directions. Grid 26 extends beyond a second aperture 44 formed through second substrate layer 24. Grid 26 will thus provide support in the area of second aperture 44 while still allowing a large open area for sound transmission.

Figure 2:
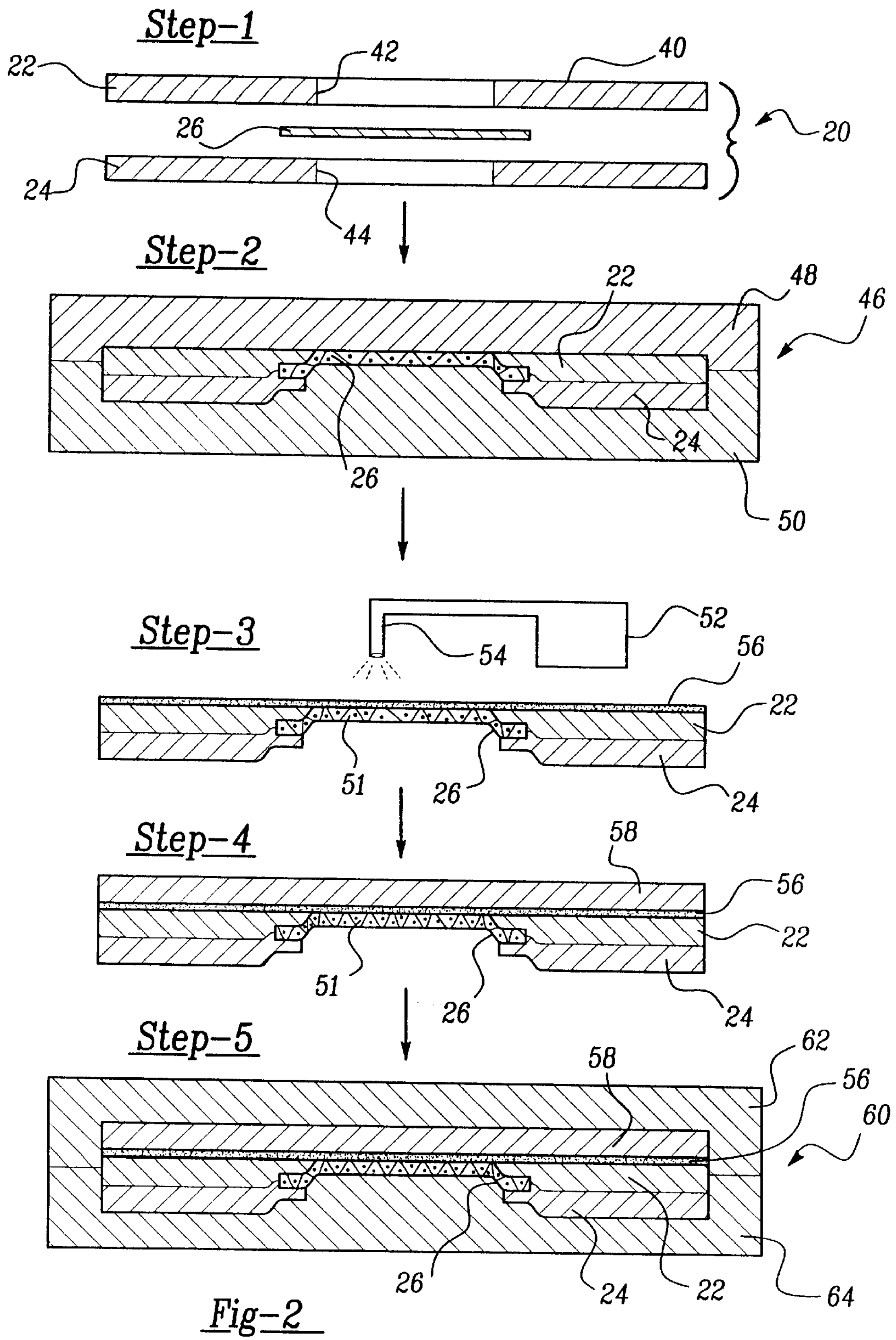
FIG. 2 is a schematic of the steps of manufacturing the composite vehicle trim panel shown in FIG. 1.

FIG. 2 is a schematic of the steps of manufacturing composite vehicle trim panel 20. First substrate layer 22 includes a top surface 40 and a first aperture 42. Second substrate layer 24 includes second aperture 44. In Step 1, first aperture 42 and second aperture 44 are aligned with each other and grid 26 is interposed between first substrate layer 22 and second substrate layer 24 and grid 26 covers first aperture 42 and second aperture 44. In Step 2, first substrate layer 22, second substrate layer 24 and grid 26 are placed in a compression mold 46 to form composite vehicle trim panel 20. Compression mold 46 includes a top half 48 and a bottom half 50. In the most preferred embodiment, compression mold 46 heats first substrate layer 22, second substrate layer 24, and grid 26 to a temperature between 400° F. to 450° F. In addition, compression mold 46 deforms grid 26 to form a deformed portion 51 in grid 26. Deformed portion 51 preferably is flush with top surface 40 of first substrate layer 22. In Step 3, a sprayer 54, which is connected to an adhesive reservoir 52, sprays an adhesive 56 across top surface 40 of first substrate layer 22. In Step 4, finish layer 58 is laid over adhesive 56. In Step 5, finish layer 58 is laminated to first substrate layer 22. As will be understood by one having ordinary skill in the art, Step 3, could comprise spraying adhesive 56 onto finish layer 58 and then placing finish layer 58 on top surface 40 of first substrate layer 22.

Figure 3:
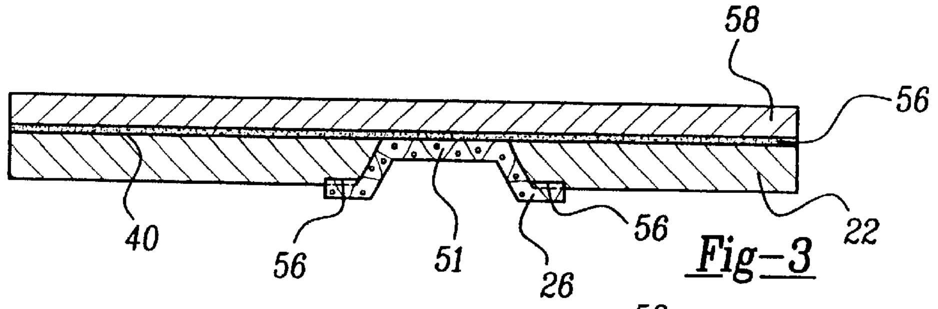
FIG. 3 is a cross-sectional view of a composite vehicle trim panel designed according to another embodiment of the present invention.

FIG. 3 is a cross-sectional view of an alternative embodiment of the present invention. In this embodiment, grid 26 is laminated, using adhesive 56, to one side of first substrate layer 22. Finish layer 58 is laminated to first substrate layer 22. Grid 26 includes deformed portion 51, which is flush with top surface 40 of first substrate layer 22. As will be understood by one having ordinary skill in the art, grid 26 could be laminated to first substrate layer 22 without deformed portion 51. In addition, grid 26 could be interposed between finish layer 58 and first substrate layer 22.

Figure 4:
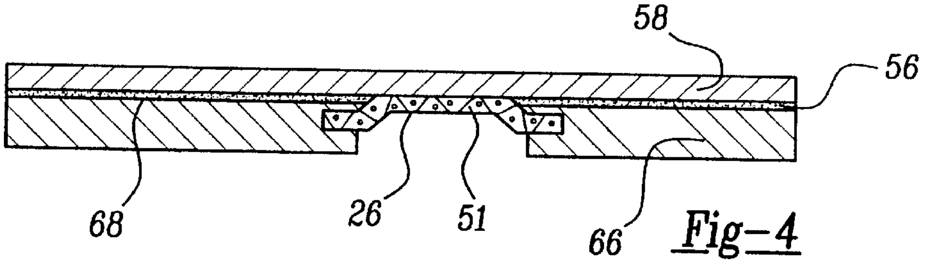
FIG. 4 is a cross-sectional view of a composite vehicle trim panel designed according to another embodiment of the present invention.

FIG. 4 is a cross-section view of an alternative embodiment of the present invention. In FIG. 4, grid 26 is secured into a substrate layer 66. Grid 26 includes deformed portion 51 which is flush with a top surface 68 of substrate layer 66. Adhesive 56 secures finish layer 58 to top surface 68 of substrate layer 66. In the most preferred embodiment, substrate layer 66 comprises injection molded plastic. As will be understood by one having ordinary skill in the art, grid 26 could be secured into substrate layer 66 without deformed portion 51. The process for injection molding a plastic such as substrate layer 66 is known in the art and forms no portion of the present invention, therefore the process is not discussed in the application.

Figure 5:
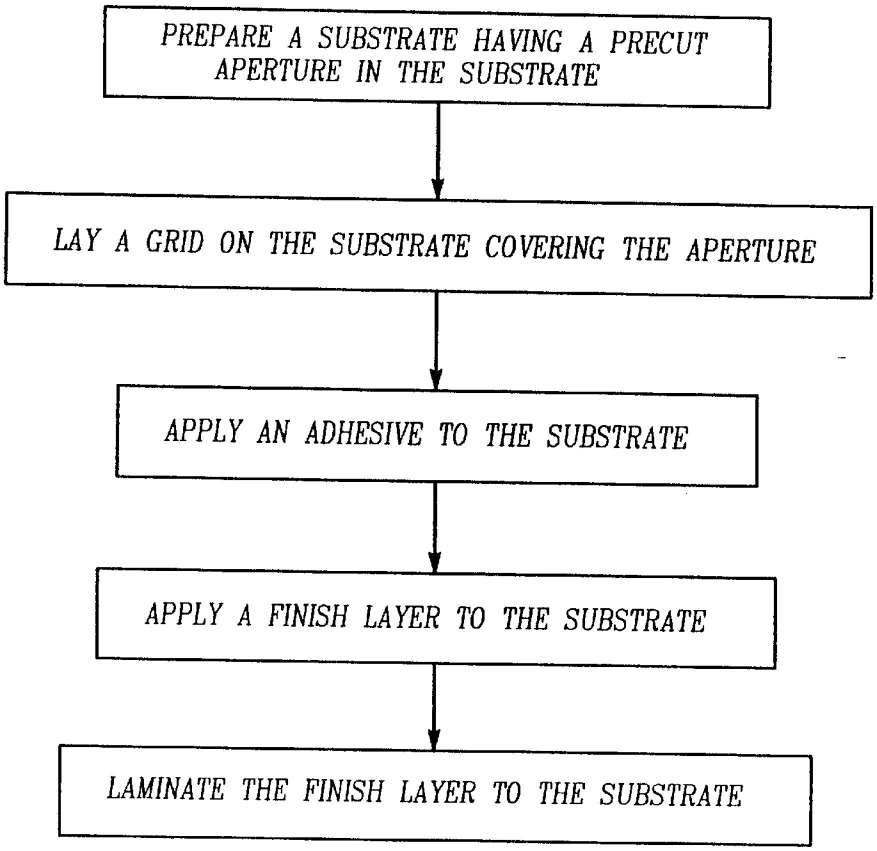
FIG. 5 is a flow chart of the method of manufacturing the composite vehicle trim panel shown in FIG. 3.

FIG. 5 is a schematic of the method of manufacturing the composite vehicle trim panel shown in FIG. 3. In Step 1, first substrate layer 22 is prepared with first aperture 42 being pre-cut. In Step 2, grid 26, with or without deformed portion 51, is laid on substrate layer 22 and covers first aperture 42. In Step 3, adhesive 56 is applied to top surface 40 and grid 26. In Step 4, finish layer 58 is applied over adhesive 56 and top surface 40. In Step 5, finish layer 58 is laminated to first substrate layer 22.

In the above described embodiments, first substrate layer 22 and second substrate layer 24 most preferably comprise a resinated shoddy blanket. Alternatively, first substrate layer 22 and second substrate layer 24 could comprise: fiberglass; uracore; or a wood fiber material. In the above described embodiments, substrate layer 66 preferably comprises an injection molded plastic. As will be understood by one having ordinary skill in the art, composite vehicle trim panel 20 could incorporate a plurality of grids 26 for a plurality of audio speakers 36. The variety of finish layers that could be utilized are as known in the art.

In the above described embodiments, grid 26 most preferably comprises a metal, for example, steel. Grid 26 could also be formed from aluminum, brass, stainless steel or other alloys. In addition, grid 26 could be formed from a high temperature plastic. Such a high temperature plastic must be able to withstand the compression molding temperatures of between 400° F. to 450° F. In the most preferred embodiment, strands 28 have a mesh size of 2. Meaning, there are two openings per linear inch of grid 26 and each of the openings is approximately one-half inch across. The mesh size can range between approximately 1.25 to 4 mesh, in other words, mesh openings between ¾ of an inch to ¼ of an inch wide per linear inch of grid 26. When the embodiment shown in FIGS. 3 and 5 is utilized, it is preferred to use a grid mesh having smaller openings. In the most preferred embodiment, the diameter of each of strands 28 is 40 thousands of an inch. The diameter of strands 28 can range between 30 thousands of an inch to 60 thousands of an inch. Thus, the mesh or open space between strands 28 is much larger than the diameter of each strand 28. Strands 28 can be interwoven as shown in FIG. 1A or bonded at the junctions. Although strands 28 are shown as parallel and perpendicular to each other they could have other arrangements as will be understood by one having ordinary skill in the art. In the most preferred embodiment, finish layer 58 comprises a carpet.

The present invention provides a composite vehicle trim panel 20 having a molded in grid 26. The open area of grid 26 is approximately 85% of first aperture 42 and second aperture 44. Thus, the present invention permits for much greater sound transmission than prior trim panels. The present invention permits a manufacturer to provide a higher quality of sound transmission utilizing the same audio speaker. Grid 26, through deformed portion 51, provides structural support to finish layer 58 and thus maintains the strength of composite vehicle trim panel 20.

The present invention has been described in accordance with the relevant legal standards, thus the foregoing description is exemplary rather than limiting in nature. Variations and modifications to the disclosed embodiment may become apparent to those skilled in the art and do come within the scope of this invention. Accordingly, the scope of legal protection afforded this invention can only be determined by studying the following claims.

I claim:

1. A composite vehicle trim panel having a grid for a speaker comprising:

a first substrate layer having at least a first aperture;

a second substrate layer having at least a second aperture, said second aperture aligned with said first aperture;

a grid formed from a mesh of crossing strands, said grid placed between said first aperture and said second aperture, said grid extending beyond the circumference of said first aperture and said second aperture; and said grid sandwiched between said first substrate layer and said second substrate layer, and said grid secured to said first substrate layer and said second substrate layer, thus forming said composite vehicle trim panel.

2. A composite vehicle trim panel as recited in claim 1, further comprising a finish layer laminated to one of said first substrate and said second substrate.

3. A composite vehicle trim panel as recite in claim 1, wherein said grid comprises metal strands.

4. A composite vehicle trim panel as recited in claim 1, wherein said grid comprises plastic strands.

5. A composite vehicle trim panel as recited in claim 1, wherein said grid comprises a mesh having between 1.25 and 4 openings per linear inch.

6. A composite vehicle trim panel as recited in claim 1, wherein said grid comprises strands each having a diameter between 30 and 60 thousands of an inch.

7. A composite vehicle trim panel having a grid for a speaker comprising:

a first substrate having a first side, a second side and at least one aperture;

a grid covering said aperture and extending beyond the circumference of said aperture, said grid formed from a network of crossing strands; and said grid laminated to one of said first side and said second side by an adhesive.

8. A composite vehicle trim panel as recite in claim 7, wherein said grid comprises metal strands.

9. A composite vehicle trim panel as recited in claim 7, wherein said grid comprises plastic strands.

10. A composite vehicle trim panel as recited in claim 7, wherein said grid comprises a mesh having between 1.25 and 4 openings per linear inch.

11. A composite vehicle trim panel as recited in claim 7, wherein said grid comprises strands each having a diameter between 30 and 60 thousands of an inch.

12. A method of forming a vehicle trim panel having a grid for a speaker, said method comprising the steps of:

a.) forming a substrate having an aperture;

b.) forming a grid of interconnected crossing strands, said grid being larger than the circumference of said aperture;

c.) covering said aperture with said grid of interconnected crossing strands; and d.) securing said grid to said substrate.

13. A method as recited in claim 12, wherein said steps a.) and steps d.) comprise injection molding a plastic to form said substrate and to secure said grid to said substrate.

14. A method as recited in claim 12, wherein step d.) comprises laminating said grid to said substrate using an adhesive.

15. A method as recited in claim 12, wherein step a.) comprises forming a resinated shoddy blanket and precutting said aperture in said resinated shoddy blanket.

16. A composite vehicle trim panel having a grid for a speaker comprising:

a first substrate layer having at least a first aperture;

a second substrate layer having at least a second aperture, said second aperture aligned with said first aperture;

a grid formed from a mesh of crossing strands, said mesh having between 1.25 and 4 openings per linear inch and said grid covering said first aperture and said second aperture; and said first substrate, said second substrate and said grid secured to each other, thus forming said composite vehicle trim panel.

17. A composite vehicle trim panel having a grid for a speaker comprising:

a first substrate layer having at least a first aperture;

a second substrate layer having at least a second aperture, said second aperture aligned with said first aperture;

a grid formed from a mesh of crossing strands, said strands each having a diameter between 30 and 60 thousands of an inch and said grid covering said first aperture and said second aperture; and said first substrate, said second substrate and said grid secured to each other, thus forming said composite vehicle trim panel.

18. A composite vehicle trim panel having a grid for a speaker comprising:

a first substrate having a first side, a second side and at least one aperture;

a grid comprising a mesh having between 1.25 and 4 openings per linear inch, said grid covering said aperture and formed from a network of crossing strands; and said grid laminated to one of said first side and said second side.

19. A composite vehicle trim panel having a grid for a speaker comprising:

a first substrate having a first side, a second side and at least one aperture;

a grid comprising strands each having a diameter between 30 and 60 thousands of an inch, said grid covering said aperture and formed from a network of crossing strands; and said grid laminated to one of said first side and said second side.

20. A method of forming a vehicle trim panel having a grid for a speaker, said method comprising the steps of:

a.) forming a substrate comprising a resinated shoddy blanket and having an aperture;

b.) covering said aperture with a grid of interconnected crossing strands; and c.) securing said grid to said substrate.

* * * * *